United States Patent [19]

Spence

[11] 4,224,532

[45] Sep. 23, 1980

[54] ONE CHIP DIRECT DRIVE AND KEYBOARD SENSING ARRANGEMENT FOR LIGHT EMITTING DIODE AND DIGITRON DISPLAYS

[75] Inventor: John R. Spence, Villa Park, Calif.

[73] Assignee: Rockwell International Corporation, El Segundo, Calif.

[21] Appl. No.: 821,363

[22] Filed: Aug. 3, 1977

Related U.S. Application Data

[62] Division of Ser. No. 654,678, Feb. 2, 1976, Pat. No. 4,100,460.

[51] Int. Cl.[3] .............................................. H03K 5/08

[52] U.S. Cl. .................................... 307/237; 307/251

[58] Field of Search ............... 340/324 R, 324 N, 336, 340/337, 365 R; 307/247 A, 251, 254, 264, DIG. 1, 237, 214; 340/365 S, 365 E

[56] References Cited

U.S. PATENT DOCUMENTS

| | | | |
|---|---|---|---|
| 3,428,832 | 2/1969 | Abbott, Jr. | 307/251 |
| 3,715,764 | 2/1973 | Hatano | 340/337 |
| 3,925,690 | 12/1975 | Spence | 340/336 |
| 3,950,743 | 4/1976 | Hatano et al. | 340/336 |
| 3,990,070 | 11/1976 | Spence | 340/337 |
| 4,070,664 | 1/1978 | Abe | 340/337 |

*Primary Examiner*—John Zazworsky
*Attorney, Agent, or Firm*—H. Fredrick Hamann; Richard A. Bachand; Wilfred G. Caldwell

[57] ABSTRACT

A circuit having two modes of operation for driving either one of a light emitting diode or a gas discharge tube (digitron) display from a single semiconductor chip. Respective voltages are supplied to the chip to enable the circuit to selectively operate in either of the light emitting diode or digitron modes.

8 Claims, 3 Drawing Figures

ONE CHIP DIRECT DRIVE AND KEYBOARD SENSING ARRANGEMENT FOR LIGHT EMITTING DIODE AND DIGITRON DISPLAYS

This is a division of application Ser. No. 654,678 filed Feb. 2, 1976 now U.S. Pat. No. 4,100,460.

BACKGROUND OF THE INVENTION

1. Field of the Invention

This invention relates to a one chip, direct drive and keyboard sensing scheme for a light emitting diode or digitron display, such as those used in an electronic calculator, or the like.

2. Prior Art

A conventional scheme for driving either a light emitting diode or digitron display, such as those found in an electronic calculator, typically requires at least two semiconductor chips. A first chip includes respective circuitry for driving the light emitting diode display. A second chip includes respective circuitry for driving the digitron display. Frequently, buffering components are required to interface each chip with its respective display. As a result, the size and corresponding cost of a conventional driver circuit is undesirably increased. Moreover, relatively complex signal processing means are frequently required to evaluate the output signals of each of the first and second chips in order to determine the switch position of a keyboard key.

SUMMARY OF THE INVENTION

Briefly, and in general terms, a ligic circuit is disclosed having two modes of operation to enable either a light emitting diode (LED) or a gas discharge tube (digitron) display to be driven from a single semiconductor chip, without the requirement of buffering components. Either an LED or a digitron voltage supply is selectively applied to the semiconductor chip to enable the logic circuit to operate in each of the respective modes of operation.

The instant logic circuit is comprised of mode determination circuitry and keyboard receiver circuitry. The mode determination circuitry receives a respective LED or digitron voltage signal and either applies the signal to control logic for a signal level shift (in the LED mode of operation) or inverts the voltage signal before the signal is applied to the control logic (in the digitron mode of operation). The keyboard receiver circuitry performs a non-inverting level shift for keyboard voltage level signals in the LED mode. Output signals are provided to a data terminal of the logic circuit, which signals are indicative of an opened or closed switch position of a keyboard key means in either mode of operation. The output signals in the LED mode of operation, are independent of the LED chip voltage supply, should the LED voltage supply (e.g. battery) become diminished with the continued passage of time.

DESCRIPTION OF THE PREFERRED EMBODIMENT

Figure 1A:
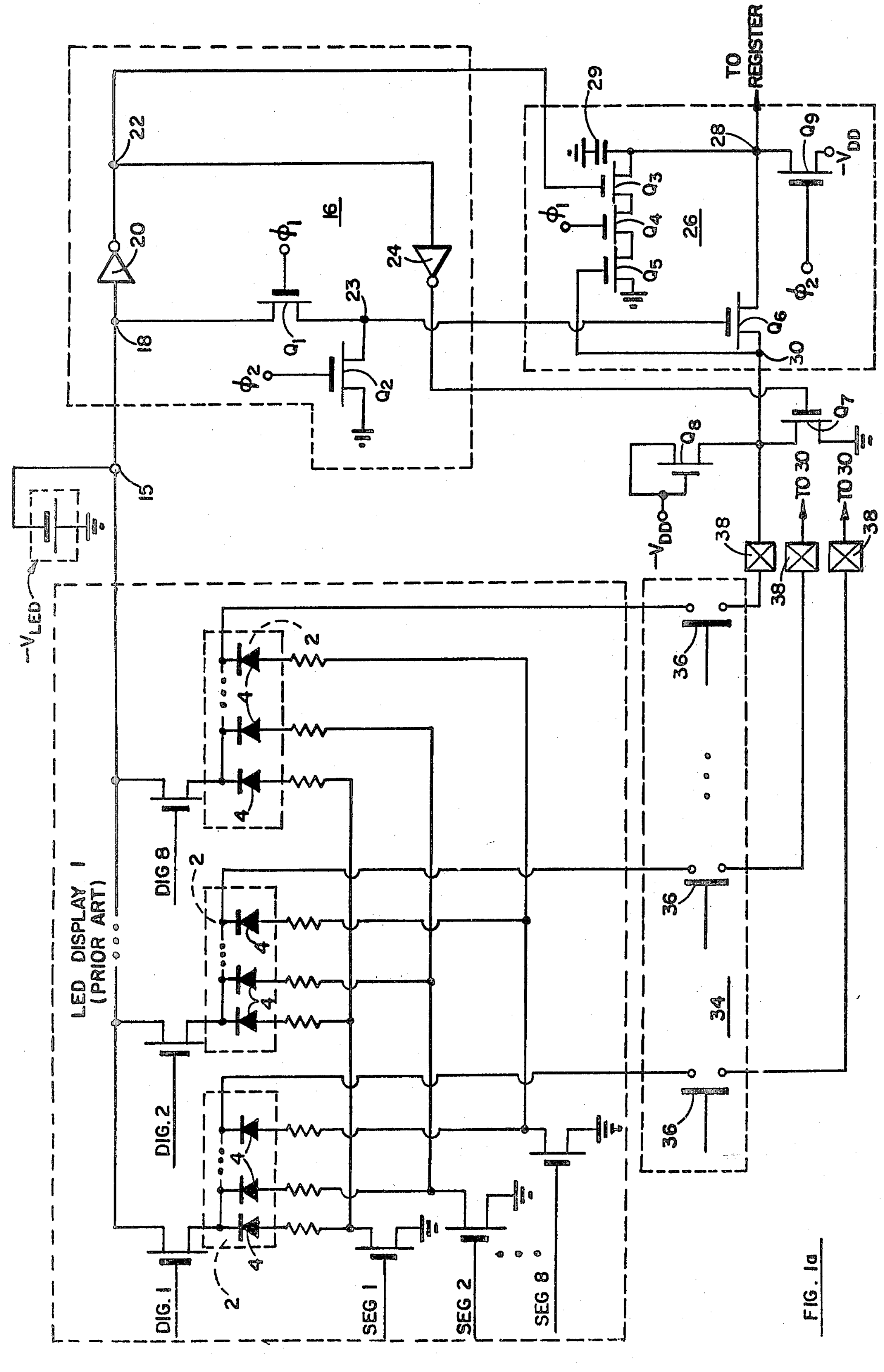
FIG. 1*a* is a schematic of the instant one chip logic circuit connected to a conventional light emitting diode display.

FIG. 1*a* shows the logic circuit for selectively enabling either of a light emitting diode (LED) display or a gas discharge tube (commonly referred to as a digitron) display to be driven directly from a single semiconductor chip. The driver circuit and the LED and digitron displays may be employed, for example, in a calculator having a digital readout. A conventional LED display 1 of FIG. 1*a* typically includes a plurality of strobe driver or digit select field effect transistors (FETs) DIG 1–DIG 8.

A digit select transistor DIG 1–DIG 8 is required to drive a respective character or symbol 2 of the display 1. Thus, where an eight digit display is utilized, eight digit select FETs DIG 1–DIG 8 are required. Each character 2 of display 1 is formed from a number of light emitting diodes 4. Each of the light emitting diodes 4, which are suitably arranged to form segments of the characters 2 of display 1, is respectively connected to one of a plurality of segment select FETs SEG 1–SEG 8. Typically, each character 2 to be displayed as a numerical digit is generally formed from seven light emitting diode segments 4 and a decimal point. Thus, at least eight segment select FETs SEG 1–SEG 8 are utilized. The segment select FETs SEG 1–SEG 8 are shared by the respective LED segments 4 which comprise each character 2 of the display 1. The operation of the LED display 1 is well-known to those skilled in the art, an understanding of which does not form the part of the instant invention. However, reference may be made to U.S. Pat. No. 3,925,690, issued Dec. 9, 1975.

Figure 1B:
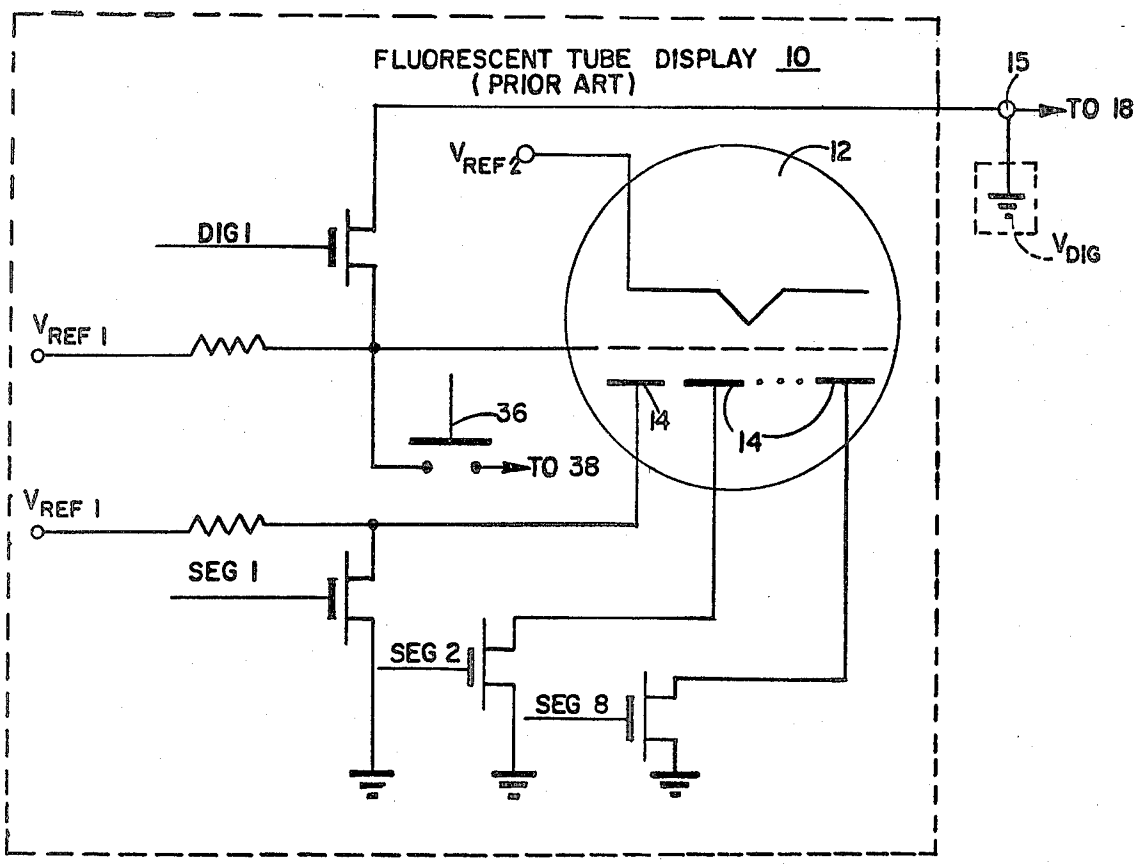
FIG. 1*b* is a schematic of a conventional gas discharge tube (digitron) display adapted to be connected to the logic circuit of FIG. 1.

Referring to FIG. 1*b*, a conventional digitron display 10 is illustrated. The digitron display 10 typically includes a gas discharge (e.g. fluorescent) tube 12 for each character comprising the display. For convenience, only one gas discharge tube 12 is shown. A respective strobe driver or digit select FET (e.g. DIG 1) is connected to the grid electrode of each gas discharge tube 12. Thus, where an eight character display is utilized, at least eight gas discharge tubes and corresponding digit select FETs are required. Each of the elements 14 comprising the plate electrode of a gas discharge tube 12 is respectively connected to one of a plurality of segment select FETs SEG 1–SEG 8. The elements 14 comprising the plate electrode of tube 12 are suitably arranged to form the segments of one character or symbol of display 10. A first source of reference potential, $V_{REF1}$, is respectively connected to both the grid and plate electrodes of tube 12 via suitable resistors. A second source of reference potential, $V_{REF2}$, is connected to the cathode electrode of tube 12. The operation of the conventional digitron display 10 is also well-known to those skilled in the art, an understanding of which does not form a part of the instant invention.

The logic circuit for selectively enabling either one of the LED display 1 or the fluorescent tube display 10 to be driven from a single semiconductor chip functions in either one of two corresponding modes of operation, an LED mode or a digitron mode. In the LED mode of operation, one of the conduction path electrodes of each of the digit select FETs DIG 1–DIG 8 of display 1 is connected together and to the light emitting diode chip voltage supply, designated $-V_{LED}$. In a preferred embodiment, the chip voltage supply, $-V_{LED}$, is a source of negative voltage, such as, for example, −9 volts d.c. In the digitron mode, one of the conduction path electrodes of each of the digit select FETs (only one of which, DIG 1, being shown) is connected together and to the digitron chip voltage supply, designated $V_{DIG}$. In a preferred embodiment, the digitron chip voltage supply $V_{DIG}$, is a source of relatively positive reference potential with respect to the LED chip voltage supply, such as ground.

In order to selectively operate the instant logic circuit in one of the two modes of operation, either the LED display 1 is connected to the corresponding light emitting diode chip voltage supply, $-V_{LED}$, or the fluorescent tube display 10 is connected to the corresponding digitron chip voltage supply, $V_{DIG}$. Display means 1 and 10 are selectively connected to their respective chip voltage supplies $-V_{LED}$ and $V_{DIG}$ by an suitable connection means 15, such as a pin means, a switch arrangement, mechanical jumper means, or the like.

Figure 2:
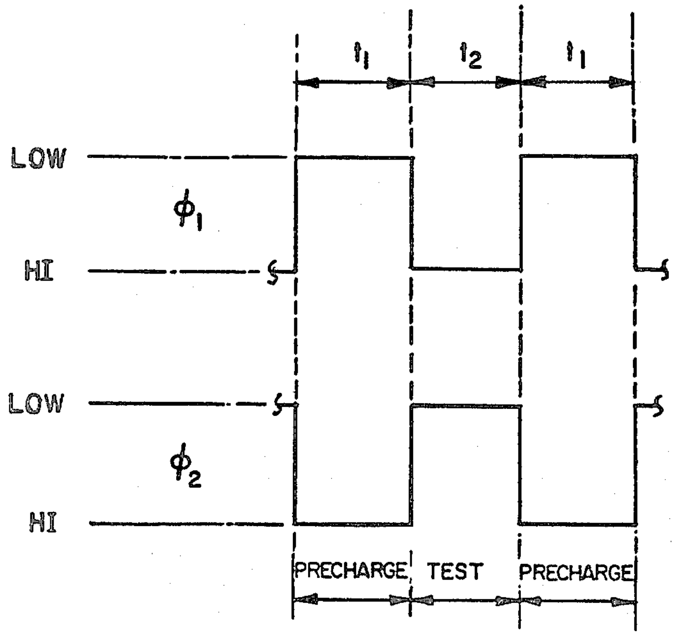
FIG. 2 is an illustration of the waveforms representative of clock control signals applied to the instant logic circuit to enable the circuit to operate in either a light emitting diode or digitron mode.

In accordance with the instant invention, the instant logic circuit includes mode determination circuitry 16. The moed determination circuitry 16 is comprised of control logic having a first inverter-amplifier gate 20. An input terminal 18 of inverter-amplifier gate 20 is selectively connected to receive one of the display chip voltages $-V_{LED}$ or $V_{DIG}$. Input terminal 18 of inverter gate 20 is connected to one conduction path electrode of a FET $Q_1$. A second conduction path electrode of FET $Q_1$ is connected to one conduction path electrode of a FET $Q_2$ at a common electrical junction 23. A second conduction path electrode of FET $Q_2$ is connected to a source of reference potential, such as ground. The control or gate electrodes of FETs $Q_1$ and $Q_2$ are connected to clock terminal means. The clock terminal means are adapted to receive suitable clock signals from a generator (not shown) thereof. By way of example, the clock signals may be multi-phase signals, designated $\phi_1$ and $\phi_2$, having different (e.g. opposite) polarities with respect to one another, as shown in FIG. 2. Output terminal 22 of first inverter gate 20 is connected to an input terminal of a second inverter-amplifier gate 24. The output terminal 22 of first inverter gate 20 is also connected to the gate electrode of FET $Q_3$.

The instant logic circuit also includes keyboard receiver circuitry 26. Keyboard receiver circuitry 26 includes the FET $Q_3$ One conduction path electrode of FET $Q_3$ is connected to one plate of a storage capacitor 29 at a common electrical junction formed at an output terminal 28 of the instant logic circuit. The second plate of capacitor 29 is connected to the source of reference potential, such as ground. A second conduction path electrode of FET $Q_3$ is connected to one conduction path electrode of a FET $Q_4$. The gate electrode of FET $Q_4$ is connected to the clock terminal means to receive the clock signal designated $\phi_1$. A second conduction path electrode of FET $Q_4$ is connected to one conduction path electrode of a FET $Q_5$. A second conduction path electrode of FET $Q_5$ is connected to the source of reference potential, such as ground. The gate electrode of FET $Q_5$ is connected to an input terminal 30 of the instant logic circuit. The conduction paths of FETs $Q_3$, $Q_4$ and $Q_5$ are connected together in series. In a preferred embodiment, FETs $Q_3$–$Q_5$ comprise an inverter, as will be explained in greater detail hereinafter.

One conduction path electrode of a FET $Q_9$ is also connected to the common electrical junction formed at output terminal 28. A second conduction path electrode of FET $Q_9$ is connected to a source of reference potential, designated $-V_{DD}$. Typically, the potential of source $-V_{DD}$ is −15 volts d.c. The gate electrode of FET $Q_9$ is connected to the clock terminal means to receive the clock signal designated $\phi_2$.

One conduction path electrode of a FET $Q_6$ is also connected to the common electrical junction formed by logic circuit output terminal 28. A second conduction path electrode of FET $Q_6$ is connected to a common electrical junction formed at logic circuit input terminal 30. The gate electrode of FET $Q_6$ is connected to the common electrical junction 23 formed by the connection of the conduction paths of FETs $Q_1$ and $Q_2$. FETs $Q_6$ and $Q_9$ comprise a non-inverting voltage level translator, as will be explained in greater detail hereinafter.

An output terminal of second inverter gate 24 is connected to the gate electrode of a FET $Q_7$ having a relatively small resistance (e.g. 2000 ohms). One conduction path electrode of FET $Q_7$ is also connected to the common electrical junction formed by driver circuit input terminal 30. A second conduction path electrode of FET $Q_7$ is connected to the source of reference potential, such as ground. One conduction path electrode of a FET $Q_8$, having a relatively large resistance with respect to that of both FET $Q_7$ and the digit select FETs DIG 1–DIG 8 (e.g. 100,000 ohms), is also connected to the common electrical junction formed by logic circuit input terminal 30. A second conduction path electrode of FET $Q_8$ is connected to the gate electrode thereof as well as to the source of reference potential $-V_{DD}$. The conduction paths of FETs $Q_7$ and $Q_8$ are connected together in series through driver circuit input terminal 30.

The keyboard 34 for energizing selected segments comprising a character of the display 1 or 10 is comprised of a plurality of suitable keys 36. Each row of keys (for convenience, only one key 36 is shown to represent each row thereof) is connected to a respective keyboard ped 38, or similar connection. Each keyboard pad 38 is connected to the common electrical junction formed by an input terminal 30 of a respective keyboard receiver circuit 26. The closing of a particular key 36 selectively connects a respective keyboard pad 38 (and, thus, an input terminal 30) to the chip voltage supply through the conduction path of a corresponding digit select FET DIG 1–DIG. 8.

In the LED mode of operation, the LED display 1 is connected by means 15 to receive the light emitting diode chip voltage supply $-V_{LED}$. The light emitting diode chip voltage supply signal, $-V_{LED}$, is also applied to the input terminal 18 of first inverter-amplifier gate 20. During a precharge interval of the clock cycle, designated $t_1$, the clock signal generator supplies a relatively LOW logic level signal $\phi_1$ (as shown in FIG. 2) to the gate electrode of FET $Q_1$. FET $Q_1$ is, thereby, rendered non-conductive. During the same $t_1$ precharge interval, the clock signal generator supplies a relatively HI logic level signal $\phi_2$ (also shown in FIG. 2) to the gate electrode of FET $Q_2$. FET $Q_2$ is, thereby, rendered conductive. Thus, the gate electrode of FET $Q_6$ is clamped to ground through common electrical junction 23 and the conduction path of FET $Q_2$. FET $Q_6$ is, thereby, rendered non-conductive, and the logic circuit output terminal 28 is thereby disconnected from the logic circuit input terminal 30 for the duration of the precharge interval.

The light emitting diode chip voltage supply signal, $-V_{LED}$, supplied to input terminal 18 is inverted by first inverter gate 20. A signal, essentially ground, is supplied from the output terminal 22 of first inverter gate 20 to an input terminal of second inverter gate 24. An inverter and amplified signal, essentially equivalent to the $-V_{DD}$ reference potential minus a threshold level drop (e.g. $-12$ volt d.c.) is supplied from the output terminal of second inverter gate 24 to the gate electrode of FET $Q_7$. FET $Q_7$ is, thereby, rendered conductive. Thus, the logic circuit input terminal 30, the gate electrode of FET $Q_5$ and the conduction path of FET $Q_8$, connected together at the common electrical junction formed by input terminal 30, are each clamped to ground through the conduction path of FET $Q_7$ for the duration of the precharge interval $t_1$. FET $Q_5$ is, thereby, rendered non-conductive. The signal, essentially ground, at the output terminal 22 of first inverter gate 20 is supplied to the gate electrode of FET $Q_3$. FET $Q_3$ is, thereby, rendered non-conductive. The clock signal generator supplies a relatively LOW level clock signal $\phi_1$ to the gate electrode of FET $Q_4$, and FET $Q_4$ is rendered non-conductive. The inverter formed by the combination of FETs $Q_3$, $Q_4$ and $Q_5$ is inoperative during the precharge interval of the LED mode of operation.

Also during the $t_1$ precharge clock interval, the clock signal generator applies a relatively HI logic level signal $\phi_2$ to the gate electrode of FET $Q_9$. FET $Q_9$ is, thereby rendered conductive. Therefore, the source of reference potential $-V_{DD}$ is conducted to logic circuit output terminal 28 through the conduction path of FET $Q_9$ in order to precharge storage capacitor 29.

During a test interval of the clock cycle, designated $t_2$, the clock signal generator supplies a relatively HI logic level signal $\phi_1$ to the gate electrode of FET $Q_1$. FET $Q_1$ is, thereby, rendered conductive. During the same $t_2$ clock interval, the clock signal generator supplies a relatively LOW logic level signal $\phi_2$ to the gate electrode FET $Q_2$. FET $Q_2$ is, thereby, rendered non-conductive. Hence, the light emitting diode chip voltage supply signal, $-V_{LED}$, is supplied from first inverter gate input terminal 18, through the conduction path of FET $Q_1$ and common electrical junction 23, to the gate electrode of FET $Q_6$. FET $Q_6$ is, thereby, rendered conductive. Thus, driver circuit outout terminal 28 can be connected to the driver circuit input terminal 30 through the conduction path of FET $Q_6$ during the $t_2$ test interval. During the $t_2$ test interval, the clock signal generator also supplies a relatively LOW logic level signal $\phi_2$ to the gate electrode of FET $Q_9$ whereby FET $Q_9$ is rendered non-conductive.

As during the $t_1$ clock interval of the LED mode of operation, an inverted and amplified signal (essentially equivalent to $-V_{DD}$ minus a threshold level) is supplied from the output terminal of second inverter gate 24 to the gate electrode of FET $Q_7$ for the duration of the $t_2$ clock interval, and FET $Q_7$ remains conductive. Thus, as previously described, the logic circuit input terminal 30, the gate electrode of FET $Q_5$ and the conducting path of FET $Q_8$, connected together at the common electrical junction formed by input terminal 30, are each still clamped to ground through the conduction path of FET $Q_7$. FET $Q_5$ remains non-conductive. The clock signal generator supplies a relatively HI logic level clock signal $\phi_1$ to the gate electrode of FET $Q_4$, and FET $Q_4$ is rendered conductive. As in the $t_1$ clock interval, the inverted signal, essentially ground, continues to be supplied from the output terminal 22 of first inverter gate 20 to the gate electrode of FET $Q_3$ for the duration of the $t_2$ test interval. Thus, FET $Q_3$ remains non-conductive, and the inverter formed by the combination of FETs $Q_3$, $Q_4$ and $Q_5$ also remains inoperative during the test interval of the LED mode of operation.

If each of the keyboard keys 36 is positioned in an open-circuited, non-depressed condition during the $t_2$ test interval of the LED mode of operation, the signal at logic circuit input terminal 30 is essentially ground (inasmuch as input terminal 30 is clamped to ground through the conduction path of FET $Q_7$). Therefore, sufficient drive voltage exists between the gate electrode of FET $Q_6$ and input terminal 30, and FET $Q_6$ remains conductive. Thus, logic circuit output terminal 28 is connected to logic circuit input terminal 30 through the conduction path of FET $Q_6$. Formerly precharged storage capacitor 29 is subsequently discharged through the conduction path of FET $Q_6$ during the $t_2$ test interval. A first logic level output signal (e.g. ground) is impressed upon output terminal 28 to provide an indication that all of the keyboard keys 36 are in a non-depressed position.

However, if a particular keyboard key 36 is selectively positioned in a closed-circuited, depressed condition so as to energize the respective character 2 of display 1 during the LED mode of operation, the light emitting diode chip voltage supply signal $-V_{LED}$ is applied through a respective keyboard ped 38 to a corresponding driver circuit input terminal 30 if a digit select switch is activated. FET $Q_6$ will, thereupon, be rendered non-conductive, inasmuch as insufficient drive voltage exists between the gate electrode of FET $Q_6$ and input terminal 30. An associated output terminal 28 is, thereby, disconnected from its corresponding input terminal 30. Therefore, storage capacitor 29, which is charged during the $t_1$ precharge interval, remains charged during the $t_2$ test interval. A second logic level output signal (essentially $-V_{DD}$ minus a threshold level) is impressed upon output terminal 28 to provide an indication that the particular keyboard 36 is depressed.

In the digitron mode of operation, the gas discharge tube display 10 is connected by means 15 to receive the digitron chip voltage supply $V_{DIG}$. The digitron chip voltage supply signal is also applied to the input terminal 18 of first inverter gate 20. During the precharge interval of the clock cycle, designated $t_1$, the clock signal generator supplies a relatively LOW logic level signal $\phi_1$ to the gate electrode of FET $Q_1$. FET $Q_1$ is, thereby, rendered non-conductive. During the same $t_1$ precharge interval, the clock signal generator applies a relatively HI logic level signal $\phi_2$ to the gate electrode of FET $Q_2$. FET $Q_2$ is, thereby, rendered conductive. The gate electrode of FET $Q_6$ is clamped to ground through common electrical junction 23 and the conduction path of FET $Q_2$. FET $Q_6$ is, thereby rendered non-conductive, and the driver circuit output terminal 28 is disconnected from the driver circuit input terminal 30 for the duration of the precharge interval $t_1$.

The digitron chip voltage supply signal, $V_{DIG}$, applied to input terminal 18 is inverted and amplified by first inverter 20. Thus, a signal, essentially equivalent to $-V_{DD}$ minus a threshold level, is supplied from output terminal 22 of first inverter gate 20 to the input terminal of second inverter gate 24. An inverted signal, essentially ground, is supplied from the output terminal of second inverter gate 24 to the gate electrode of FET $Q_7$. FET $Q_7$ is, thereby, rendered non-conductive, and the former clamp of input terminal 30 to ground through the conduction path of FET $Q_7$ during the LED mode of operation is removed during the $t_1$ precharge interval of the digitron mode of operation. Therefore, reference potential source $-V_{DD\,L}$ is connected through the conduction path of FET $Q_8$ to the common electrical junction formed at input terminal 30 and the gate electrode of FET $Q_5$. FET $Q_5$ is, thereby, rendered conductive. During the $t_1$ interval, the clock signal generator supplies a relatively LOW logic level clock signal $\phi_1$ to the gate electrode of FET $Q_4$, and FET $Q_4$ is rendered non-conductive. The inverted and amplified signal at first inverter gate output terminal 22 is also supplied to the gate electrode of FET $Q_3$. FET $Q_3$ is, thereby, rendered conductive. However, the inverter formed by the series connection of FETs $Q_3$, $Q_4$ and $Q_5$ remains inoperative during the precharge interval of the digitron mode of operation, inasmuch as FET $Q_4$ disconnects FET $Q_3$ from FET $Q_5$.

During the $t_1$ precharge clock interval, the clock signal generator also applies a relatively HI logic level signal $\phi_2$ to the gate electrode of FET $Q_9$. FET $Q_9$ is, thereby, rendered conductive. Therefore, output terminal 28 is connected to reference potential source means $-V_{DD}$ through the conduction path of FET $Q_9$ in order to precharge storage capacitor 29.

During a test interval of the clock cycle of the digitron mode of operation, designated $t_2$, the clock signal generator supplies a relatively HI logic level signal $\phi_1$ to the gate electrode of FET $Q_1$. FET $Q_1$ is, thereby, rendered conductive. During the same $t_2$ clock interval, the clock signal generator supplies a relatively LOW logic level signal $\phi_2$ to the gate electrode of FET $Q_2$. FET $Q_2$ is, thereby, rendered nonconductive. Hence, the digitron chip voltage supply signal $V_{DIG}$ (i.e. ground) is applied from first inverter gate input terminal 18, through the conduction path of FET $Q_1$ and common electrical junction 23, to the gate electrode of FET $Q_6$. FET $Q_6$ is, thereby, rendered non-conductive for the duration of the test interval $t_2$.

As during the $t_1$ clock interval of the digitron mode of operatin, an inverted signal, essentially ground, is supplied from the output terminal of second inverter gate 24 to the gate electrode of FET $Q_7$ for the duration of the $t_2$ clock interval. FET $Q_7$ continues to be rendered non-conductive, and the former clamp of input terminal 30 to ground through the conduction path of FET $Q_7$ during the LED mode of operation continues to be removed during the $t_2$ clock interval of the digitron mode of operation. Hence, the source of reference potential $-V_{DD}$ is connected through the conduction path of FET Q8 to the common electrical junction formed by the gate electrode of FET $Q_5$ and the driver circuit input terminal 30. FET $Q_5$ continues to be rendered conductive. The clock signal generator supplies a relatively HI logic level clock signal $\phi_1$ to the gate electrode of FET $Q_4$, and FET $Q_4$ is rendered conductive. The inverted and amplified signal at first inverter gate output terminal 22 is still supplied to the gate electrode of FET $Q_3$. FET $Q_3$ also continues to be rendered conductive, and the inverter formed by the series connection of FETs $Q_3$, $Q_4$ and $Q_5$ is activated during the test interval of the digitron mode of operation.

During the $t_2$ clock interval, the clock signal generator also supplies a relatively LOW logic level clock signal $\phi_2$ to the gate electrode of FET $Q_9$. FET $Q_9$ is, thereby rendered non-conductive. Hence, the driver circuit output terminal 28 discharges to ground through the series connected conduction paths of inverter FETs $Q_3$–$Q_5$.

If each of the keyboard keys 36 is positioned in an open-circuited, non-depressed condition during the $t_2$ test interval of the digitron mode of operation, a first logic level signal (e.g. ground) corresponding to the first logic level signal produced during the LED mode of operation, is impressed upon the driver circuit output terminal 28. This is a result of a FET $Q_6$ being rendered non-conductive and output terminal 28 being clamped to ground through the series connected conduction paths of inverter FETs $Q_3$–$Q_5$.

However, if a keyboard key 36 is selectively positioned in a closed-circuited, depressed condition, and a corresponding digit select FET is rendered conductive so as to energize a respective character of display 10 during the digitron mode of operation, a digitron chip voltage supply signal $V_{Dig}$ is applied through the conduction path of the digit select FET (e.g. DIG 1) and a respective keyboard pad 38 to a corresponding logic circuit input terminal 30. The corresponding logic circuit input terminal 30 is thereupon clamped to the digitron chip voltage supply $V_{DIG}$ (i.e. ground). Consequently, the gate electrode of FET $Q_5$ is supplied with a relatively LOW logic level signal. FET $Q_5$ is rendered non-conductive, and the inverter comprised of FETs $Q_3$–$Q_5$ is, thereby, inoperative. Hence, an associated output terminal 28 is no longer clamped to ground through the conduction paths of inverter FETs $Q_3$–$Q_5$. FET $Q_6$ is still rendered non-conductive, and output terminal 28 remains disconnected from its corresponding input terminal 30. Likewise, FET $Q_9$ is non-conductive. Therefore, storage capacitor 29, which is charged during the $t_1$ precharge interval, remains charged during the $t_2$ test interval. A second logic level signal (essentially $-V_{DD}$ minus a threshold level), corresponding to the second logic level signal produced during the LED mode of operation, is impressed upon output terminal 28 to provide an indication that the particular keyboard key 36 is depressed.

By virtue of the instant logic circuit, either of an LED or digitron displays means can be driven by a single semiconductor chip without the necessity of buffering components. Moreover, each of the respective logic level signals impressed upon logic circuit output terminal 28 during the test clock interval $t_2$, corresponds to the same relative positions of the keyboard keys 36 (i.e. ground, when all of the keys are in a non-depressed condition, and $-V_{DD}$ minus a threshold level, when a selected key is in a depressed condition) regardless of whether the logic circuit is operating in the LED mode or in the digitron mode. Thus, the information held by output terminal 28 may be supplied to a suitable register, such as an accumulator, without the interconnection of complex signal processing means.

It will be recognized that the keyboard receiver circuitry inverter, comprised of the series connection of FETs $Q_3$, $Q_4$ and $Q_5$ is inoperative for the duration of the LED mode of operation and the precharge clock interval $t_1$ of the digitron mode of operation. However, the inverter is otherwise activated during the test clock interval $t_2$ of the digitron mode of operation. As previously disclosed, logic circuit input terminal 30 is connected to the gate electrode of inverter FET $Q_5$. Logic circuit output terminal 28 can be clamped to ground during the digitron made through the series connected conduction paths of inverter FETs $Q_3$–$Q_5$. Hence, the respective logic level signals of input and output terminals 30 and 28 are maintained at different levels with respect to one another by means of inverter FETs $Q_3$, $Q_4$ and $Q_5$. More particularly, when input terminal 30 has a relatively HI logic level signal impressed thereon, output terminal 28 is clamped to ground. When input terminal 30 has a relatively LOW logic level signal impressed thereon, output terminal 28 is subsequently charged to a logic level signal essentially equivalent to $-V_{DD}$ minus a threshold voltage level drop of FET $Q_9$.

As previously disclosed, the keyboard receiver circuitry 26 also includes a non-inverting voltage level transiator for keyboard voltage level signals, comprised of FETs $Q_6$ and $Q_9$. During the $t_2$ test interval of the LED mode of operation, the light emitting diode chip voltage supply signal, $-V_{LED}$, is connected to both the gate electrode of FET $Q_6$, through FET $Q_1$, and a driver circuit input terminal 30, through a respective keyboard pad 38, when a corresponding key 36 is selectively depressed. Should the $-V_{LED}$ voltage diminish with the passage of time (e.g. from $-9$ volts to $-5$ volts d.c.), the respective logic level signals impressed upon driver circuit output terminal 28 (i.e. either ground or $-V_{DD}$ minus a threshold level) remain clearly distinguishable from one another. Thus, the logic level signals at output terminal 28 are maintained independent from the light emitting diode chip voltage supply $-V_{LED}$. Moreover, with a key depressed, the logic level signal impressed upon a driver circuit output terminal 28 is shifted by a threshold level (i.e. essentially from $-V_{LED}$ to $-V_{DD}$) with respect to the signal at a corresponding driver circuit input terminal 30. For a more detailed description of a voltage level transistor circuit similar to that described above, reference may be made to the aforementioned U.S. Pat. No. 3,990,070.

It will be apparent that while a preferred embodiment of the invention has been shown and described, various modifications and changes may be made without departing from the true spirit and scope of the invention. For example, in a preferred embodiment, FETs $Q_1$–$Q_8$ are p-channel devices. However, it is to be understood that any other suitable multi-terminal semiconductor device may also be employed. Therefore, the polarities of the clock signals ($\phi_1$ and $\phi_2$) and the supplies (e.g. $-V_{LED}$, $V_{DIG}$ and $-V_{DD}$) and the resulting logic level signals impressed upon logic circuit terminals 28 and 30 will correspond to the type of semiconductor devices which comprise the instant logic circuit.

Having thus set forth a preferred embodiment of the instant invention, what is claimed is:

1. A circuit to provide an indication of the condition of a switch to be connected to a supply of drive voltage, said circuit including:

source means for providing a plurality of reference potentials, input terminal means connected to said switch, output terminal means, first transistor gate means connected between said input and output terminal means, and having a control terminal, second transistor gate means to connect said drive voltage supply to said control terminal of said first transistor gate means to control the conductivity thereof, first clamping means connected to clamp said output terminal means to a first of said plurality of reference potentials when said switch is in a first condition, and second clamping means connected to clamp said output terminal means to a second of said plurality of reference potentials when said switch is in a second condition.

2. The circuit recited in claim 1, wherein said first clamping means comprises a multi-terminal semiconductor device having a conduction path connected between said source means and said output terminal means to clamp said output terminal means to a first of said plurality of reference potentials when said switch is in a closed circuit condition and said first transistor gate is disabled.

3. The circuit recited in claim 1, wherein said second clamping means comprises a multi-terminal semiconductor device having a conduction path connected between said source means and said input terminal means, said multi-terminal device clamping each of said input and output terminal means to the second of said plurality of reference potentials when said switch is in an opened circuit condition and said first transistor gate means is enabled.

4. The circuit recited in claim 3, wherein said multi-terminal semiconductor device comprises a signal inverter.

5. The circuit recited in claim 1, wherein said second clamping means comprises logic means having a first terminal connected to said drive voltage supply, a second terminal connected to said circuit input terminal means, and an output terminal connected to said circuit output terminal means, said logic means clamping said circuit output terminal means to the second of said plurality of reference potentials when said switch is in an opened circuit condition.

6. The circuit recited in claim 5, wherein said logic means comprises a signal inverter.

7. The circuit recited in claim 5, including inverter means connected between said drive voltage supply and the first terminal of said logic means.

8. The circuit recited in claim 1, wherein said second clamping means comprises first, and second, and third multi-terminal semiconductor devices connected in electrical series between said circuit output terminal means and said source means to receive the second of said plurality of reference potentials, each of said devices having a control terminal, the control terminal of the first multi-terminal device connected to said drive voltage supply, the control terminal of said second multi-terminal device connected to receive an alternating high and low voltage, and the control terminal of said third multi-terminal device connected to said circuit input terminal means.

* * * * *